(12) United States Patent
Seningen et al.

(10) Patent No.: US 9,412,469 B1
(45) Date of Patent: Aug. 9, 2016

(54) WEAK BIT DETECTION USING ON-DIE VOLTAGE MODULATION

(71) Applicant: Apple Inc., Cupertino, CA (US)

(72) Inventors: Michael R. Seningen, Austin, TX (US);
Michael A. Dreesen, Austin, TX (US);
Edward M. McCombs, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/621,527

(22) Filed: Feb. 13, 2015

(51) Int. Cl.
*G11C 7/06* (2006.01)
*G11C 7/00* (2006.01)
*G11C 29/04* (2006.01)
*G11C 5/14* (2006.01)

(52) U.S. Cl.
CPC .............. *G11C 29/04* (2013.01); *G11C 5/147* (2013.01); *G11C 7/00* (2013.01)

(58) Field of Classification Search
None
See application file for complete search history.

(56) References Cited

U.S. PATENT DOCUMENTS

| | | | |
|---|---|---|---|
| 5,917,766 A | 6/1999 | Tsuji et al. | |
| 7,463,508 B2 | 12/2008 | Pineda De Gyvez et al. | |
| 7,495,979 B2 | 2/2009 | Chung | |
| 7,852,692 B2 | 12/2010 | Zhang et al. | |
| 2009/0296480 A1* | 12/2009 | Lee | G11C 16/30 365/185.18 |

* cited by examiner

*Primary Examiner* — Harry W Byrne
*Assistant Examiner* — Sultana Begum
(74) *Attorney, Agent, or Firm* — Meyertons, Hood, Kivlin, Kowert & Goetzel, P.C.

(57) ABSTRACT

Methods and apparatuses for performing a disturb test on a memory are disclosed. Circuitry may be configured to store test data into one or more data storage cells. A regulation circuit may adjust a level of a power supply coupled to the one or more data storage cells from a first level to a second level. Once the voltage level of the power supply has reached the second level, the circuitry may perform a read operation on the one or more data storage cells. Upon completion of the read operation, the regulation circuit may return the voltage level of the power supply to the first level, and the circuitry may perform another read operation, the results of which, the circuitry may compare to the test data.

20 Claims, 6 Drawing Sheets

WEAK BIT DETECTION USING ON-DIE VOLTAGE MODULATION

BACKGROUND

1. Technical Field

Embodiments described herein relate to integrated circuits, and more particularly, to techniques for testing a memory circuit.

2. Description of the Related Art

Memories typically include a number of data storage cells composed of interconnected transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-couple inverters may be employed to form a static storage cell or a floating gate metal-oxide semiconductor field-effect transistor (MOSFET) may be used to create a non-volatile storage cell.

During the semiconductor manufacturing process, variations in lithography, transistor dopant levels, etc., may result in different electrical characteristics between storage cells that are intended to have identical characteristics. Additional variation in electrical characteristics may occur due to aging effects within the transistors as the device is repeatedly operated. These differences in electrical characteristics between transistors can result in data storage cells that output different small signal voltages for the same stored data.

In order to detect data storage cells that have characteristics that may make operation problematic, various tests may be performed on the data storage cells. External test devices may be employed to provide test data for storage, different power supply voltage levels, different temperatures, and the like.

SUMMARY OF THE EMBODIMENTS

Various embodiments of a computing system are disclosed. Broadly speaking, a circuit and a method are contemplated in which a disturb test may be performed on one or more data storage cells. Circuitry may be configured to store test data in the one or more data storage cells. A regulation circuit may be configured to change a voltage level of a power supply coupled to the one or more data storage cells from a first level to a second level. The circuitry may perform a read operation on the one or more data storage cells in response to the change in the voltage level of the power supply. The regulation may circuit may then change the voltage level of the power supply back to the first level, at which point, the circuitry may perform another read operation and compare the results to the test data.

In one embodiment, the second level may be less than the first level. In another non-limiting embodiment, the second level may be greater than the first level.

In a further embodiment, circuitry may be further configured to generate a test signal dependent upon the results of the comparison between the read results and the test data. The circuitry may then send the test signal.

BRIEF DESCRIPTION OF THE DRAWINGS

The following detailed description makes reference to the accompanying drawings, which are now briefly described.

Figure 1:
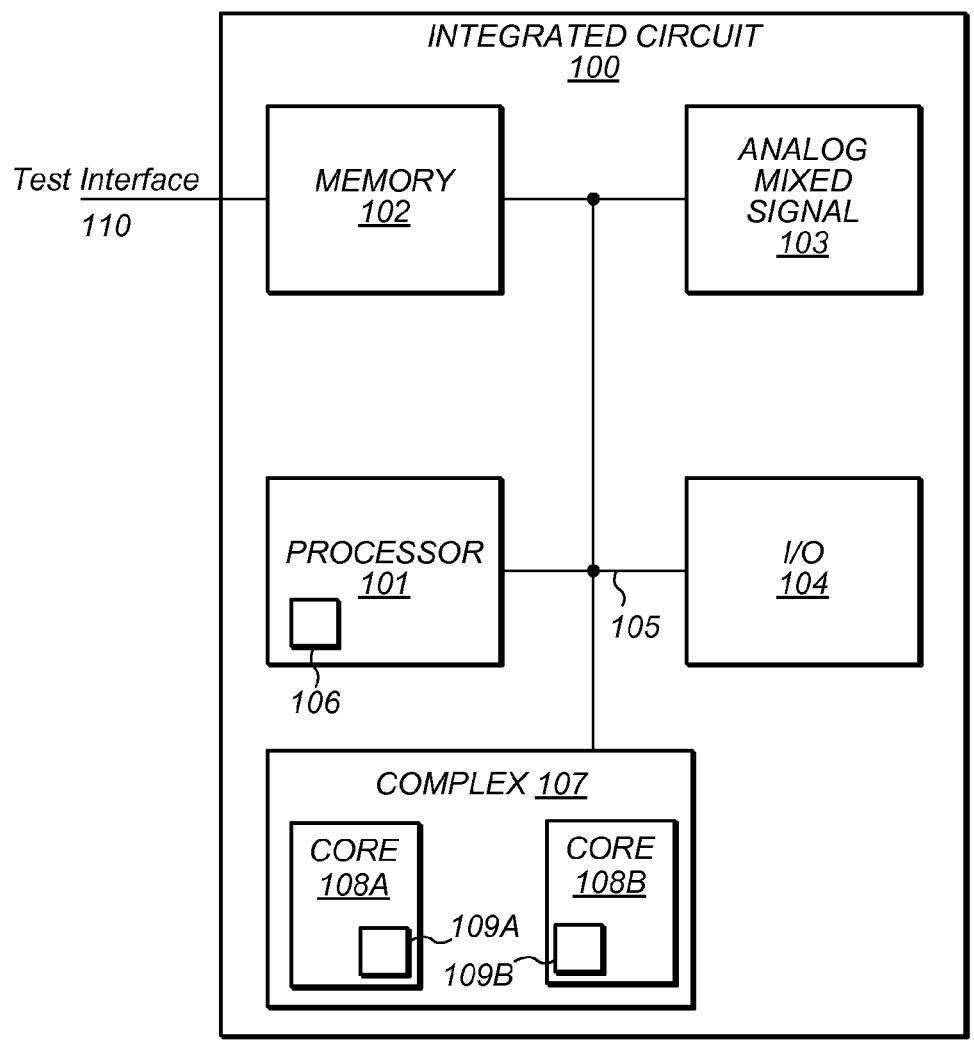
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

During the manufacture of a semiconductor memory circuit, differences in lithography, implant levels, etc., may result in differences in electrical characteristics between data storage cells that are otherwise intended to be identical in characteristics and performance. In some cases, the variation of the electrical characteristics of a data storage cell may be sufficiently large that the data storage cell may not function (e.g., read or write) under normal operating conditions of the memory circuit, resulting in the data storage cell being identified as a failure and requiring replacement with a redundant data storage cell.

To determine data storage cells with electrical characteristics that may present problems during operation, multiple testing procedures may be performed. Testers external to an integrated circuit may be employed to perform such tests. In some cases, however, certain operations, such as, e.g., changing a voltage level of a power supply, may require a significant amount of time to realize. As a result, a cost associated with performing such memory tests may be high. The embodiments illustrated in the drawings and described below may provide techniques for using on-chip circuitry to perform certain memory tests thereby reducing test time and cost.

A block diagram of an integrated circuit is illustrated in FIG. 1. In the illustrated embodiment, the integrated circuit 100 includes a processor 101, and a processor complex (or simply a "complex") 107 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more energy modeling units 106 which may be configured to estimate both dynamic and leakage power consumption on a cycle and execution thread basis. In other embodiments, any functional unit, such as, e.g., I/O block 104, may include an energy modeling unit.

Complex 107 includes processor cores 108A and 108B. Each of processor cores 108A and 108B may be representative of a general-purpose processor configured to execute software instructions in order to perform one or more computational operations. Processor cores 108A and 108B may be designed in accordance with one of various design styles. For example, processor cores 108A and 108B may be implemented as an ASIC, FPGA, or any other suitable processor design. Each of processor cores 108A and 108B may, in various embodiments, include energy modeling units 109A and 109B, respectively. Energy modeling units 109A and 109B may each monitor energy usage within their respective processor cores thereby allowing, in some embodiments, accounting of energy associated with a given process being executed across multiple processor cores.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 1, a single memory block is depicted. In other embodiments, any suitable number of memory blocks may be employed.

In addition to being coupled to internal bus 105, memory 102 may also be coupled to test interface 110. In some embodiments, test interface 110 may provide Direct Memory Access (DMA) to memory 102 for testing and characterization purposes. In some embodiments, test data may be stored in one or more data storage cells of memory 102 from an external device, such as, e.g., a tester, through test interface 110. Memory 102 may, in various embodiments, send signals indicative of test results through test interface 110 to the external device. In other embodiments, test information, such as, e.g., test data, test results, and the like, may be transferred in and out of memory 102 through internal bus 105 under the control of processor 101, or any other processor core suitable for accessing memory 102.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

It is noted that the embodiment illustrated in FIG. 1 is merely an example. In other embodiments, different functional units and different configurations of functional units are possible and contemplated.

Figure 2:
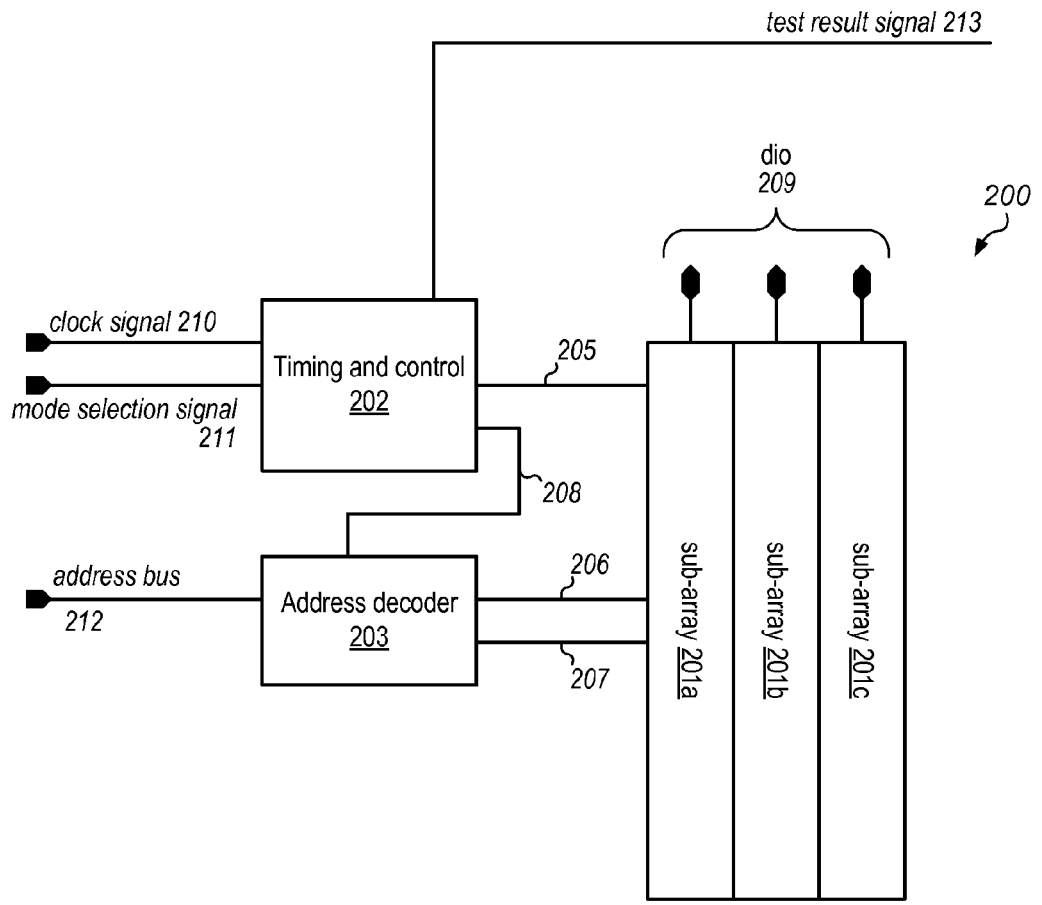
FIG. 2 illustrates an embodiment of a memory unit.

Turning now to FIG. 2, an embodiment of a memory is illustrated. In the illustrated embodiment, memory 200 includes data I/O ports 209, an address bus input 212, mode selection signal 211, and a clock input 210. Memory 200 may, in various embodiments, correspond to 102 of integrated circuit 100 as illustrated in FIG. 1.

In the illustrated embodiment, memory 200 includes sub-arrays 201a, 201b, and 201c, timing and control unit 202, and address decoder 203. Sub-arrays 201a, 201b, and 201c may incorporate some or all of the features described above with respect to sub-arrays 201a-c. Timing and control unit 202 is coupled to provide a decoder enable signal 208 to address decoder 203 and control signals 205 to sub-arrays 201a, 201b, and 201c. In some embodiments, control signals 205 may include a pre-charge signal, and a sense amplifier enable signal.

Each of sub-arrays 201a-c includes multiple data storage cells, amplifier circuits, and input/output circuits (all not shown). The data storage cells may be arranged in rows and columns, and may be of any suitable type, such as, SRAM data storage cells, for example. Each row of data storage cells may be coupled to a respective one of row selects 206. Data read from a given subset of data storage cells may be amplified and output through data I/O ports 209. Data to be stored in a particular group of data storage cells may be input through data I/O ports, latched, and the written into selected data storage cells. In some embodiments, comparison circuits may be included in each of sub-arrays 201 a-c so that data read from selected data storage cells may be compared to previously stored test data. Comparison results may, in some embodiments, be sent to timing and control unit 202.

Timing and control unit 202 may be configured to generate control signals 205 and decoder enable signal 208 dependent on clock signal 210 and mode selection signal 211. Control signals 205 may, in some embodiments, include signals for enabling and operating sense amplifiers, data input and output latches, write driver circuits and the like. Decoder enable signal 208 may activate or enable address decoder 203. During a particular test mode, timing and control unit 202 may receive results of a comparison between test data and recently read data. Based on the comparison results, timing and control unit 202 may generate test result signal 213 and transmit the test result signal to another functional unit within an integrated circuit, or off-chip to an external testing device. In other embodiments, timing and control unit may receive test data and/or instructions via a dedicated test interface, such as, e.g., test interface 110 as depicted in FIG. 1.

Timing and control unit 202 may be designed according to one of various design styles. In some embodiments, timing and control unit 202 may include multiple latches or flip-flops configured to form a sequential logic circuit or state machine. In other embodiments, timing and control unit 202 may include a general-purpose processor configured to execute software instructions stored in a memory separate from memory 200.

Address decoder 203 is coupled to provide row selects 206 and column selects 207 to sub-arrays 201a, 201b, and 201c, in response to the assertion of decoder enable signal 208 and the address value on address bus 212. In various embodiments, address decoder 203 may employ multiple stages of logic gates, or other suitable circuits, for translating the address value on address bus 212 into a given one or row selects 206 and a given one of column selects 207.

The embodiment depicted in FIG. 2 is merely an example. In various embodiments, different numbers of sub-arrays, different numbers of row and column selects may be employed.

Figure 3:
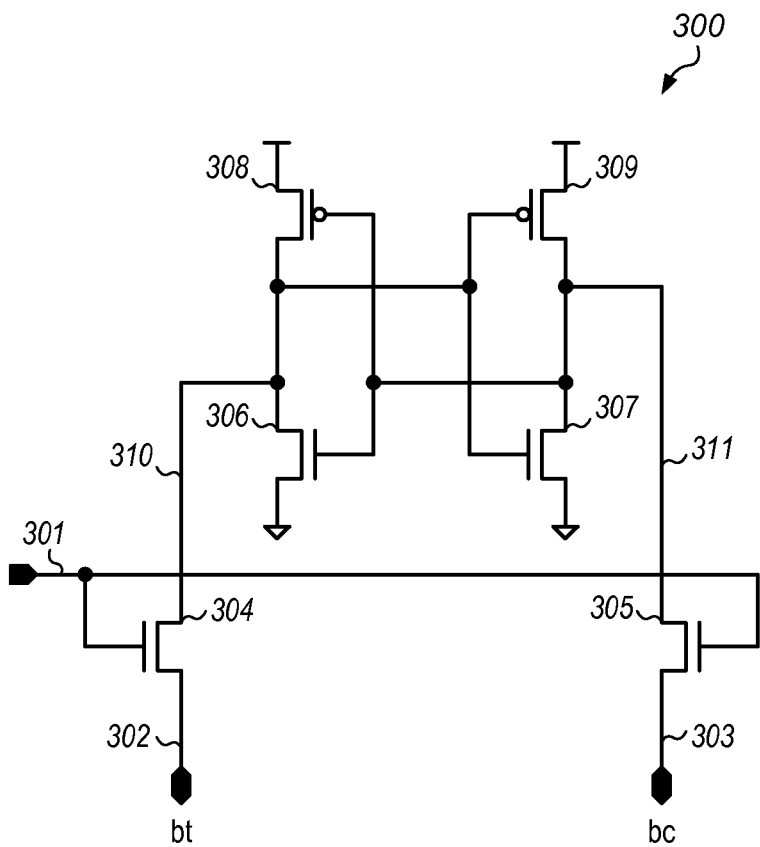
FIG. 3 illustrates an embodiment of a data storage cell.

FIG. 3 illustrates a data storage cell according to one of several possible embodiments. In the illustrated embodiment, data storage cell 100 includes a true I/O 02 denoted as "bt," a complement I/O 103 denoted as "bc," and a selection input 301. Data storage cell 100 may, in some embodiments, correspond to a type of data storage cell included in sub-arrays 201a-c as illustrated in FIG. 2

In the illustrated embodiment, bt 302 is coupled to selection transistor 304 and bc 303 is coupled to selection transistor 305. Selection transistor 304 and selection transistor 305 are controlled by 301. Selection transistor 304 is further coupled to pull-up transistor 308 and pull-down transistor 306 through node 310, and selection transistor 305 is further coupled to pull-up transistor 309 and pull-down transistor 307 through node 311. Pull-up transistor 308 and pull-down transistor 306 are controlled by node 311, and pull-up transistor 309 and pull-down transistor 307 are controlled by node 310.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other transconductance element of any suitable type (e.g., a metal-oxide semiconductor field-effect transistor (MOSFET)), or to a collection of transistors.

As used and described herein, a pull-up transistor is a transistor coupled between a power supply node and another circuit node. Moreover, a pull-down transistor is a transistor coupled between a ground supply node and another circuit node. In the embodiments illustrated herein, power supply and ground supply nodes for a particular circuit, such as, e.g., data storage cell 300, are coupled to respective power and ground terminals. Such terminals may then be coupled to power supplies or ground supplies external to the circuit.

It is noted that in this embodiment, low refers to a voltage at or near ground potential and high refers to a voltage sufficiently large to turn on n-channel metal oxide semiconductor field-effect transistors (MOSFETs) and turn off p-channel MOSFETs. In other embodiments, other circuit configurations may be used and the voltages that constitute low (logical 0) and high (logical 1) may be different.

At the start of the storage operation true I/O 302 and complement I/O 303 may both be high and selection input 301 is low. During the storage, or write, operation, selection input 301 may be switched high which couples true I/O 302 to node 310 and complement I/O 303 to node 311. To store a logical 1 into data storage cell 300, complement I/O 303 may be switched to a low. Since selection transistor 305 is on, node 311 is also switched low. The low on node 311 activates pull-up transistor 308 which charges node 310 high. The high on node 310, in turn, activates pull-down transistor 307, which further reinforces the low on node 311 establishing regenerative feedback. Once this regenerative feedback between nodes 310 and 311 has been established, selection input 301 may be switched low turning off selection transistor 304 and selection transistor 305, isolating node 310 from true I/O 302 and node 311 from complement I/O 303. The method of storing a logical 0 may be similar. Selection input 301 may be switched high and true I/O 302 may be switched low. Selection transistor 304 couples the low on true I/O 302 to node 310, which activates pull-up transistor 309. The high on node 311 activates pull-down transistor 306, reinforcing the low on node 310 and establishing the regenerative feedback. Data storage cells that store data via regenerative feedback are commonly referred to as static cells.

In the illustrated embodiment, data storage cell 300 outputs its stored data as the difference in voltage between true I/O 302 and complement I/O 303. (Data stored as the difference between two voltages may also be referred to herein as "differentially encoded".) At the start of the output process, true I/O 302 and complement I/O 303 may both be high and selection input 301 may be low. Asserting selection input 301 activates selection transistor 304 and selection transistor 305. If node 311 is low and node 310 is high, then a current will flow through selection transistor 305 and pull-down transistor 307 causing a reduction in voltage on complement I/O 303. If node 310 is low and node 311 is high, then a current will flow through selection transistor 304 and pull-down transistor 306 causing a reduction in voltage on true I/O 302. For either data state, the current that the data storage cell sinks from either the true I/O 302 or complement I/O 303 is referred to as the read current of the cell.

Ideally, the electrical characteristics of pull-down transistor 306 and pull-down transistor 307 would be identical, as would be the electrical characteristics of selection transistor 304 and selection transistor 305. Furthermore, in an ideal circuit, it might be desirable that pull-down transistor 306 and pull-down transistor 307 in one data storage cell in a memory device have identical electrical characteristics to pull-down transistor 306 and pull-down transistor 307 in another data storage cell in the memory device. During the semiconductor manufacturing process, however, differences in lithography, fluctuations in dopant levels, etc., may result in these transistors having different electrical characteristics (e.g., saturation current). Aging effects induced by, e.g., hot-carrier injection may also change a transistor's electrical characteristics over time. Variation, due to both manufacturing and aging effects, in pull-down transistor 306, pull-down transistor 307, selection transistor 304 and selection transistor 305 from one data storage cell to another may result in variation in read currents, and, therefore variation in output voltages for the same stored data.

In some cases, the variation in the electrical characteristics of the transistors may result in larger than average output voltages when the storage cell is read. Data storage cells that generate larger than average output voltages may be referred to as strong cells. In some cases, the variation in the electrical characteristic of the transistors may result in smaller than average output voltages when the storage cell is read. Data storage cells that generate smaller than average output voltages may be referred to as weak cells and may be susceptible to small variations a voltage level of a power supply. If the value of the output voltage generated by a weak storage cell is sufficiently small, it may not be possible to properly determine the data stored in the data storage cell, because the output voltage may not be able to overcome imbalances and signal noise within a sense amplifier.

Such variation in the electrical characteristics may also result in small amounts of change being transferred into or out of data storage cell 300 via selection transistors 304 and 305. In such cases, the resulting change in voltage level on nodes 310 and 311 resulting from the transfer of charge may result in data storage cell 300 being unstable. When data storage cell 300 is subsequently accessed, data stored in data storage cell 300 may change polarity corrupting the originally stored data. By performing an operation on the data storage cell at power supply voltage level different than a nominal supply voltage and then accessing the data storage cell again using the nominal power supply voltage level (commonly referred to as a "disturb test"), data storage cells sensitive to this phenomenon may be identified.

It is noted that the number of transistors and the connectivity shown in FIG. 3 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or flash memory) may be used to store data in a data storage cell Turning to FIG. 4, an embodiment of an array of data storage cells is illustrated. Array 400 may, in various embodiments, correspond to a given one of sub-arrays 201a-c as depicted in FIG. 2. In the illustrated embodiment, array 400 includes data storage cells 401a through 401f, and regulator unit 402.

Each of data storage cells 401 a-f is coupled to array supply 405. Moreover, each of data storage cells 401 a-c is coupled to word line 406, and each of data storage cells 401 d-f is coupled to word line 407. In various embodiments, word line 406 and word line 407 may each correspond to one of row selects 206 as illustrated in FIG. 2.

Data storage cells 401 a-f may, in various embodiments, correspond to data storage cell 300 as illustrated in FIG. 3. In some embodiments, data storage cells 401 a-f may include any suitable type of data storage cell including, but no limited to, DRAM storage cells, SRAM storage cells, FLASH storage cells, and the like.

Regulation unit 402 may be configured to generate a voltage level on array supply 405. In various embodiments, the voltage level on array supply 405 may vary with operating mode. For example, during a sleep or retention mode of operation, the voltage level on array supply 405 may be less than a voltage level on power supply 403. In other cases, regulation unit 402 may generate a voltage higher than the voltage level on power supply 403 to improve certain operating characteristics, such as, write margin, for example.

In some embodiments, regulation unit 402 may adjust the voltage level on array supply 405 in response to test signal 404. As described below in more detail, regulation unit 402 may change the voltage level on array supply 405 prior to an initial read or write operation performed on data storage cells 401 a-f as part during a disturb test. Regulation unit 402 may be configured to provide multiple different voltage levels on array supply 405 to allow for disturb testing at a variety of conditions.

Although only a single regulation unit is depicted in the embodiment of FIG. 2, in other embodiments, any suitable number of regulation units may be employed. For example, in some embodiments, a single regulation unit may be used for each row of data storage cells.

Figure 5:
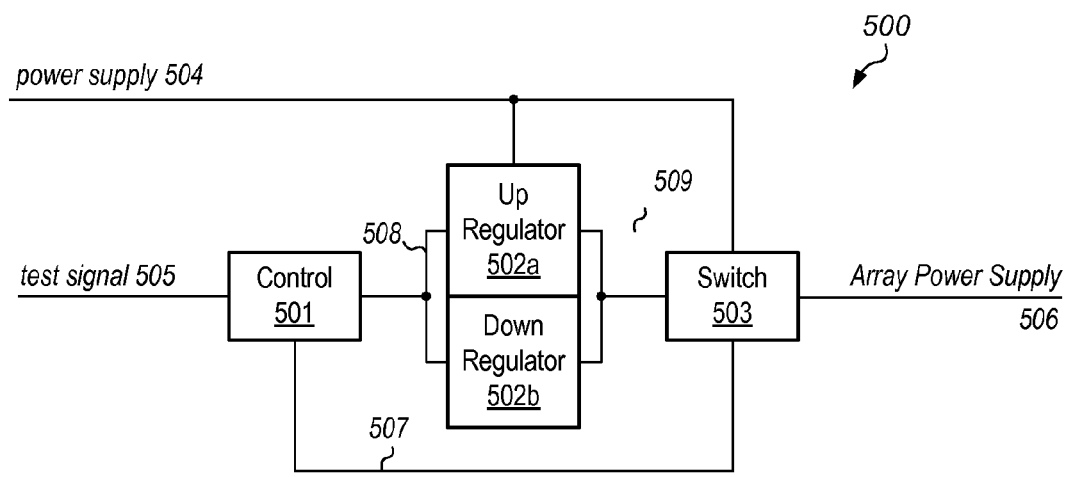
FIG. 5 illustrates an embodiment of a regulation unit.

An embodiment of a regulation unit is illustrated in FIG. 5. Regulation unit 500 may, in various embodiments, correspond to regulation unit 402 as illustrated in FIG. 2. In the illustrated embodiment, regulation unit 500 includes control unit 501, up regulator unit 502a, down regulator unit 502b, and switch 503.

Control unit 501 is coupled to receive test signal 505 and generate signal 508 coupled to up regulator 502a and down regulator 502b, and signal 507 coupled to switch 503. In response to test signal 505, control unit 501 may select a voltage level to use for testing for array power supply 506. Accordingly, control unit 501 may, via signal 508, activate one of up regulator 502a or down regulator 502b to achieve the selected voltage level. Additionally, control unit 501 may activate signal 507 causing switch 503 to couple to the output of either up regulator 502a or down regulator 502b to array power supply 506. As described below in more detail, upon completion of a first read operation, control unit 501 may change a value of signal 507 thereby coupling array power supply 506 to power supply 504.

In various embodiments, control unit 501 may include multiple flip-flops or latches coupled together to form a sequential logic circuit or state machine. Alternatively, control unit 501 may be a general-purpose processor configured to execute software instructions stored in memory.

Up regulator 502a may be configured to generate a voltage level in excess of a voltage level on power supply 504. In some embodiments, up regulator 502a may be capable of generating multiple different voltage levels dependent upon signal 508 from control unit 501. Up regulator 502a may be designed according to one of various design styles and may include multiple capacitors coupled to regulator output 509. Such capacitors may be used to couple array power supply 506 to a voltage level higher than the voltage level of power supply 504 (commonly referred to as "boosting").

Down regulator 502b may be configured to generate a voltage level less than the voltage level on power supply 504. As with up regulator 502a, down regulator 502b may be capable of generating multiple different voltage levels dependent upon signal 508 from control unit 501. In some embodiments, down regulator 502b may employ one or more resistors or other suitable impedances, such as, e.g., a biased MOSFET, between power supply 504 and array power supply 506 to generate the desired voltage levels on array power supply 506. Active circuits configured to generate the desired voltage levels may be employed in other embodiments.

Figure 4:
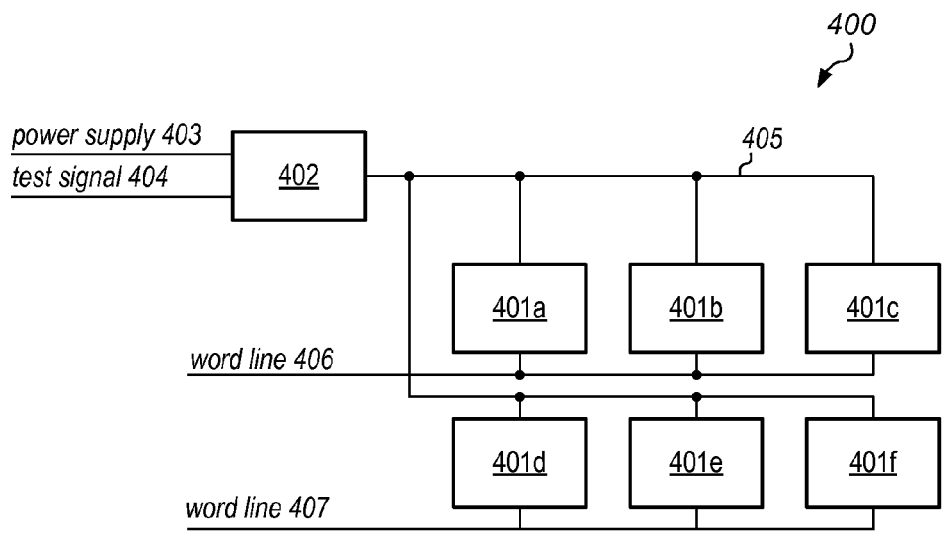
FIG. 4 illustrates an embodiment of an array of data storage cells.

Switch 503 may be configured to couple either regulator output 509 or power supply 504 to array power supply 506 dependent upon the state of signal 507. It is noted that in some embodiments, array power supply 506 may correspond to array supply 405 as illustrated in FIG. 4. Switch 503 may be designed in accordance with one of various design styles. For example, switch 503 may include multiple CMOS transmission gates coupled, or other suitable switch structure, to provide a selectable low impedance path between power supply 504 or regulator output 509 to array power supply 506.

It is noted that the embodiment illustrated in FIG. 5 is merely an example. In other embodiments, different types of regulation circuits and different arrangements of switches may be employed.

Figure 6:
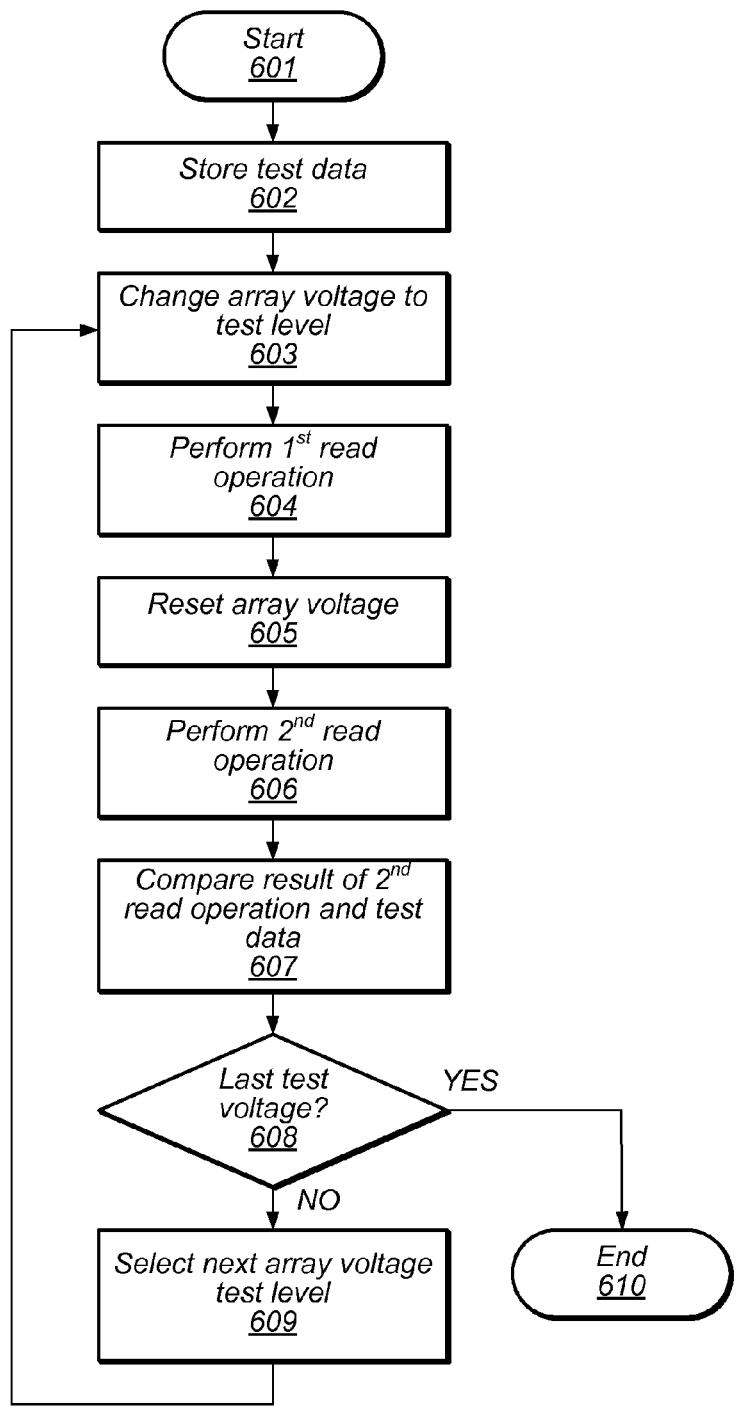
FIG. 6 depicts a flow diagram illustrating an embodiment of a method for performing a disturb test.

Turning to FIG. 6, a flow diagram depicting an embodiment of a method for performing a disturb test is illustrated. Referring collectively to FIG. 2, FIG. 4, and the flow diagram of FIG. 6, the method begins in block 601.

Timing and control circuit 202 may then store test data into one or more data storage cells included in sub-arrays 201a-c (block 602). In various embodiments, the test data may be received from a source external to memory 200, such as, e.g., a processor, or off-chip external tester. The test data may include any suitable combination of logical 1 or logical 0 values.

Regulation unit 402 may then adjust a voltage level of array supply 405 (block 603). In some embodiments, the voltage level of array supply 405 may be decreased while, in other embodiments, the voltage level of array supply 405 may be increased. Regulation unit 402 may employ any suitable method for adjusting the voltage level of array supply 405. For example, regulation unit 402 may couple a resistor or other impedance between power supply 403 and array supply 405 to reduce the voltage level of array supply 405. Alternatively, regulation unit 402 may employ one or more capacitors to boost the voltage level of array supply 405 higher than a voltage level of power supply 403. It is noted that due to the relatively small load on array supply 405, the time to change the voltage level of array supply 405 may be less than in cases where an external testing device is employed.

A first read operation may then be performed on the one or more data storage cells (block 603). In some embodiments, address decoder 203 may be configured to store the addresses use when the test data was originally stored. The stored addresses may then be re-used during the first read operation. In other embodiments, the addresses may be received from a source external to the memory.

Once the first read operation has been performed, the voltage level of array supply 405 may be returned to its original level (block 605). In some embodiments, regulation unit 402 may decouple any impedance between power supply 403 and array supply 405 thereby allowing the voltage level of array supply 405 to return to the original level. Alternatively, one or more current sources could be coupled to array supply 405 to either source current to or sink current from array supply 405 in order to return the voltage level of array supply 405 to the original level.

With the voltage level of array supply 405 at the original level, a second read operation may then be performed (block 606). As with the first read operation, the second read operation is performed at the same set of addresses as used to store the test data. Timing and control unit 202 or other suitable circuitry, may then compare the results of the second read operation to the test data (block 607). In some embodiments, a test signal may be generated indicating the results of comparison. For example, if the results of the second read operation do not match the test data, the test signal may be sent to a test port or external testing device indicating that the test failed. In some embodiments, address information indicating the location of the failure, and the voltage level used during the test may also be included with the test signal.

The method may then depend on the voltage level used during the test (block 608). If the most recently used voltage level was the last voltage level at which the one or more data storage cells were to be tested, then the method concludes in block 610. Alternatively, if additional voltage levels are to be tested, then a new voltage level for array supply 405 may then be selected (block 609). Then method may then proceed from block 603 as described above.

It is noted that the embodiment illustrated in FIG. 6 is merely an example. In other embodiments, different operations, and different orders of operations are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of data storage cells;
   circuitry configured to store test data in a first subset of the plurality of data storage cells; and
   a first regulation circuit configured to modify a first voltage level supplied to a first power terminal coupled to each data storage cell included in the first subset of the plurality of data storage cells from a first value to a second value;
   a second regulation circuit configured to modify a second voltage level supplied to a second power terminal coupled to each data storage cell included in a second subset of the plurality of data storage cells;
   wherein the circuitry is further configured to perform a first read operation on the first subset of data storage cells in response to the modification of the voltage level;
   wherein the first regulation circuit is further configured to modify the first voltage level from the second value to the first value; and
   wherein the circuitry is further configured to:
      perform a second read operation on the at least one data storage cell in response to the modification of the first voltage level from the second value to the first value; and
      compare the test data to data retrieved from the first subset of the plurality of data storage cells during the second read operation.

2. The apparatus of claim 1, wherein the second value is less than the first value.

3. The apparatus of claim 1, wherein the second value is greater than the first value.

4. The apparatus of claim 1, wherein to compare the test data to the data retrieved from first subset of the plurality of data storage cells during the second read operation, the circuitry is further configured to send a test signal dependent upon a result of the comparison.

5. The apparatus of claim 1, wherein to modify the first voltage level supplied to the first power terminal, the first regulation circuit is further configured to couple an impedance between a primary power supply and the power terminal.

6. The apparatus of claim 1, wherein to modify the first voltage level supplied to the first power terminal, the first regulation circuit is further configured to couple a capacitor between a primary power supply and the first power terminal.

7. A method, comprising:
storing test data in first subset of a plurality of data storage cells included in a memory;
changing, by a first regulation unit, a first voltage level supplied to a first power terminal coupled to each data storage cell of the first subset of the plurality of data storage cells from a first value to a second value, wherein the second value is different than the first value, wherein the first regulation circuit is included on the same die with the memory;
generating, by a second regulation unit, a second voltage level supplied to a second power terminal coupled to each data storage cell of a second subset of the plurality of data storage cells;
reading first data from the first subset of the plurality of data storage cells;
changing the first voltage level from the second value to the first value;
reading second data from the first subset of the plurality of data storage cells; and
comparing the second data to the test data.

8. The method of claim 7, wherein the second value is less than the first value.

9. The method of claim 7, wherein the second value is greater than the first value.

10. The method of claim 7, wherein comparing the second data to the test data comprises sending a test signal dependent upon a result of the comparison.

11. The method of claim 7, wherein changing, by the first regulation unit, the first voltage level supplied to the first power terminal comprises coupling an impedance between a primary power supply and the first power terminal.

12. The method of claim 11, wherein the impedance comprises a metal-oxide semiconductor field-effect transistor (MOSFET).

13. The method of claim 7, wherein changing, by the first regulation unit, the first voltage level comprises coupling a capacitor between a primary power supply and the first power terminal.

14. A system, comprising:
a processor; and
a memory coupled to the processor, wherein the memory includes a plurality of data storage cells, a first regulation circuit and a second regulation circuit, and wherein the memory is configured to:
receive test data from the processor;
store the test in a first subset of the plurality of data storage cells;
wherein the first regulation circuit is configured to change a first voltage level supplied to a first power terminal coupled to each data storage cell included in the first subset of the plurality of data storage cells from a first value to a second value level, wherein the second value is different than the first value;
wherein the second regulation circuit is configured to generate a second voltage level supplied to a second power terminal coupled to each data storage cell included in a second subset of the plurality of data storage cells;
wherein the memory is further configured to:
read first data from the first subset of the plurality of data storage cells;
change the first voltage level from the second value to the first value;
read second data from first subset of the plurality of data storage cells; and
compare the second data with the test data.

15. The system of claim 14, wherein the second value is less than the first value.

16. The system of claim 14, wherein the second value is greater than the first value.

17. The system of claim 14, wherein the memory is further configured to send a test signal dependent upon a result of the comparison.

18. The system of claim 14, wherein to change the first voltage level supplied to the first power terminal, the first regulation circuit is further configured to couple an impedance between a primary power supply and the first power terminal.

19. The system of claim 18, wherein the impedance comprises a metal-oxide semiconductor field-effect transistor (MOSFET).

20. The system of claim 14, wherein to change the first voltage level of the first power terminal, the first regulation circuit is further configured to couple a capacitor to the first power terminal.

* * * * *